(12) United States Patent
Lin et al.

(10) Patent No.: US 11,767,591 B2
(45) Date of Patent: *Sep. 26, 2023

(54) DETACHABLE ATOMIC LAYER DEPOSITION APPARATUS FOR POWDERS

(71) Applicant: SKY TECH INC., Hsinchu County (TW)

(72) Inventors: Jing-Cheng Lin, Hsinchu County (TW); Jung-Hua Chang, Hsinchu County (TW); Chia-Cheng Ku, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 11 days.

This patent is subject to a terminal disclaimer.

(21) Appl. No.: 17/334,773

(22) Filed: May 30, 2021

(65) Prior Publication Data

US 2022/0106686 A1 Apr. 7, 2022

(30) Foreign Application Priority Data

Oct. 6, 2020 (TW) ................................ 109134655

(51) Int. Cl.
  *C23C 16/455* (2006.01)
  *C23C 16/44* (2006.01)
(52) U.S. Cl.
  CPC .... *C23C 16/45544* (2013.01); *C23C 16/4412* (2013.01)
(58) Field of Classification Search
  None
  See application file for complete search history.

(56) References Cited

U.S. PATENT DOCUMENTS

| | | | | |
|---|---|---|---|---|
| 5,003,919 A | * | 4/1991 | Yamamoto | B22F 1/145 118/716 |
| 2004/0255858 A1 | * | 12/2004 | Lee | C23C 16/45544 118/715 |
| 2009/0084317 A1 | * | 4/2009 | Wu | C23C 16/45544 118/728 |
| 2011/0003088 A1 | * | 1/2011 | Honda | B01J 2/12 118/723 E |
| 2012/0085284 A1 | * | 4/2012 | Dassel | C23C 16/442 118/716 |
| 2013/0059073 A1 | * | 3/2013 | Jiang | C04B 35/62222 118/715 |

(Continued)

*Primary Examiner* — Karla A Moore
(74) *Attorney, Agent, or Firm* — Chun-Ming Shih; HDLS IPR SERVICES

(57) ABSTRACT

A detachable atomic layer deposition apparatus for powders is disclosed, which includes a vacuum chamber, a shaft sealing device, and a driving unit. The driving unit is connected to the shaft sealing device. The vacuum chamber is fixed to one end of the shaft sealing device via at least one fixing member. The driving unit drives the vacuum chamber to rotate via the shaft sealing device to agitate the powders in a reaction space of the vacuum chamber to facilitate the formation of thin films with uniform thickness on the surface of the powders. In addition, the vacuum chamber can be removed from the shaft sealing device for users to take out the powders from the vacuum chamber and clean the vacuum chamber, thereby improving the convenience in usage.

8 Claims, 7 Drawing Sheets

(56) References Cited

U.S. PATENT DOCUMENTS

| | | | |
|---|---|---|---|
| 2015/0125599 A1* | 5/2015 | Lindfors | C23C 16/45555 118/716 |
| 2016/0369396 A1* | 12/2016 | Sammelselg | C23C 16/45555 |
| 2017/0073807 A1* | 3/2017 | Kostamo | C23C 16/45555 |
| 2017/0327948 A1* | 11/2017 | Dadheech | C23C 16/4417 |
| 2018/0028998 A1* | 2/2018 | Ahn | C01B 33/021 |
| 2022/0106682 A1* | 4/2022 | Lin | C23C 16/4557 |
| 2022/0106684 A1* | 4/2022 | Lin | C23C 16/45574 |
| 2022/0106685 A1* | 4/2022 | Lin | C23C 16/403 |
| 2022/0136103 A1* | 5/2022 | Lin | C23C 16/45544 118/719 |
| 2022/0162750 A1* | 5/2022 | Lin | C23C 16/4417 |
| 2022/0341036 A1* | 10/2022 | Lin | C23C 16/45525 |
| 2023/0120393 A1* | 4/2023 | Lin | C23C 16/45544 118/715 |

\* cited by examiner

DETACHABLE ATOMIC LAYER DEPOSITION APPARATUS FOR POWDERS

REFERENCE TO RELATED APPLICATIONS

This non-provisional application claims priority claim under 35 U.S.C. § 119(a) on Taiwan Patent Application No. 109134655 filed Oct. 6, 2020, the entire contents of which are incorporated herein by reference.

TECHNICAL FIELD

The present disclosure relates to a detachable atomic layer deposition apparatus for powders, more particularly, to a detachable atomic layer deposition apparatus that is convenient for user to take out powders from a vacuum chamber and clean the vacuum chamber, so as to improve the convenience in using the apparatus.

BACKGROUND

Nanoparticle is generally defined as a particle that is smaller than 100 nanometers in at least one dimension, and in comparison to macroscopic matter, nanoparticle is completely different in both physical and chemical properties. Broadly speaking, the physical property of macroscopic matter is unrelated to its size, but the same cannot be said for nanoparticle. Nanoparticles are currently being studied for potential applications in biomedical, optical, and electronic fields.

Quantum dot is a semiconductor nanoparticle and the semiconductor material currently being studied includes materials in groups II~VI like ZnS, CdS, CdSe, etc, in which CdSe is the most promising. The size of Quantum dot is usually between 2 to 50 nanometers. Electron in the quantum dot absorbs energy after being irradiated by ultra-violet light and transitions from valence band to conductance band. When the stimulated electron returns to the valence band from the conductance band, it releases the energy by emission of light.

The energy gap of a quantum dot is associated to its size, wherein the larger the size of a quantum dot, the smaller the energy gap which in turn emits light with longer wavelength after radiation, and the smaller the size of a quantum dot, the larger the energy gap which in turn emits light with shorter wavelength after radiation. For example, a quantum dot of 5 to 6 nanometers emits orange or red light, whereas a quantum dot of 2 to 3 nanometers emits blue or green light; the light color is, of course, determined by the material composition of the quantum dot.

Light generated by light emitting diode (LED) that utilizes quantum dots is near continuous spectrum and has good color rendering, which are beneficial in improving the luminous quality of LED. In addition, the wavelength of the emitted light can be adjusted by changing the size of quantum dot. Therefore quantum dots have become a main focus in developing the next generation of light-emitting devices and displays.

Although nanoparticles and quantum dots have the aforementioned advantages and properties, agglomeration of the nanoparticles occurs easily during application and manufacturing process. Moreover, nanoparticles have higher surface activities and are prone to react with air and water vapor, which are factors that shorten the life cycle of nanoparticles.

In particular, agglomeration occurs when the quantum dots are being manufactured as sealant for LED and thereby decreasing the optical performance of quantum dots. Further, after the quantum dots are made as the sealant of LED, it is still possible for surrounding oxygen or water vapor to penetrate through the sealant and come in contact with the surface of the quantum dots, thereby causing the quantum dots to be oxidized and affecting the efficacy or life cycle of the quantum dots and LED. The surface defects and dangling bonds of the quantum dots may also cause non-radiative recombination, which also affects the luminous efficiency of quantum dots.

Atomic layer deposition (ALD) is a process currently used by industries to form a thin film with nanometer thickness or a plurality of thin films on the surface of the quantum dots to form a quantum well.

ALD process can form a thin film with a uniform thickness on a substrate with precision in controlling the thickness of the thin film, and so in theory ALD process could also be applicable to three-dimensioned quantum dots. When the quantum dots sit on a support pedestal, contacts exist between adjacent quantum dots, and these contacts cannot be reached by a precursor gas of ALD. Thus, thin films with uniform thickness cannot be formed on the surface of all nanoparticles.

SUMMARY

In general, ALD process needs to be performed under vacuum, and so the atomic layer deposition apparatus is usually bulk in size and heavy in weight, which is difficult for users to move around and operate. Hence, the present disclosure provides a detachable atomic layer deposition apparatus for powders that allows the user to remove a vacuum chamber from a shaft sealing device and/or a driving unit after conducting ALD process on powders, and is convenient for the user to take out the powders from the vacuum chamber and clean the vacuum chamber.

An object of the present disclosure is to provide a detachable atomic layer deposition apparatus for powders, mainly including a driving unit, a shaft sealing device, and a vacuum chamber. The driving unit is connected to one end of the shaft sealing device, and the other end of the shaft sealing device is fixed to the vacuum chamber via at least one fixing member, whereby the driving unit drives the vacuum chamber to rotate through the shaft sealing device. When the ALD process is finished, the vacuum chamber can be removed from the shaft sealing device so that the user can take out the powders from the vacuum chamber and clean the vacuum chamber, which in turn enhances the convenience in usage.

An object of the present disclosure is to provide a detachable atomic layer deposition apparatus for powders, in which a vacuum chamber with powders that just underwent ALD process could be taken down from the shaft sealing device, and another vacuum chamber with powders could be placed on and fixed to the shaft sealing device to undergo ALD process, therefore the process efficiency is enhanced.

An object of the present disclosure is to provide a detachable atomic layer deposition apparatus for powders, wherein a recess is disposed at a bottom of a vacuum chamber, and an inner tube that protrudes from a shaft sealing device is inserted in the recess on the bottom of the vacuum chamber and forms a protruding tube part in a reaction space of the vacuum chamber. An air intake line extends from the inner tube to the protruding tube part for facilitating a non-reactive gas transported by the air intake line to blow the powders around in the reaction space, which in turn reduces contacts between the powders and enhances the formation of a thin film with a uniform thickness on the surfaced of each powder.

An object of the present disclosure is to provide a detachable atomic powder layer deposition apparatus for powders, wherein a filter unit is disposed at a bottom of a vacuum chamber, and when a shaft sealing device is connected to the vacuum chamber, an air extraction line disposed in the shaft sealing device is fluidly connected to a reaction space of the vacuum chamber via the filter unit and extract gas from the vacuum chamber through the filter unit. Hence, a loss of powders in the vacuum chamber during gas extraction is prevented.

To achieve the aforementioned objects, the present disclosure provides a detachable atomic layer deposition apparatus for powders, which includes a shaft sealing device, a driving unit, a vacuum chamber, at least one air extraction line, and at least one air intake line. The driving unit is connected to the shaft sealing device. The vacuum chamber includes a reaction space for accommodating a plurality of powders and is fixed to the shaft sealing device via at least one fixing member, wherein when the fixing member is dislodged, the vacuum chamber separates from the shaft sealing device. Through the shaft sealing device, the driving unit drives the vacuum chamber to rotate. The air extraction line is fluidly connected to the reaction space of the vacuum chamber for extracting a gas in the reaction space. The air intake line is fluidly connected to the reaction space of the vacuum chamber for transporting a precursor gas or a non-reactive gas to the reaction space, wherein the non-reactive gas blows the powders around in the reaction space.

Preferably, the shaft sealing device is a magnetic fluid shaft seal.

Preferably, the shaft sealing device includes an outer tube and an inner tube. The outer tube has an accommodating space for accommodating the inner tube, and the inner tube has at least one connection space for accommodating the air extraction line and the air intake line.

Preferably, the driving unit is connected to the vacuum chamber via the outer tube and drives the vacuum chamber to rotate through the outer tube.

Preferably, the air intake line includes at least one non-reactive gas line disposed in the connection space of the inner tube and fluidly connected to the reaction space of the vacuum chamber for transporting the non-reactive gas to the reaction space of the vacuum chamber to blow the powders around in the reaction space.

Preferably, the vacuum chamber comprises a recess disposed at a bottom of the vacuum chamber. The recess extends from the bottom of the vacuum chamber to the reaction space for accommodating the inner tube that protrudes from the shaft sealing device and forming a protruding tube part in the reaction space.

Preferably, the detachable atomic layer deposition apparatus further includes a filter unit disposed in the recess of the vacuum chamber, and the air extraction line and the air intake line are fluidly connected to the reaction space of the vacuum chamber via the filter unit.

Preferably, the detachable atomic layer deposition apparatus further includes a heater and a temperature sensing unit disposed in the inner tube. The heater is used to heat the connection space of the inner tube and the air intake line, and the temperature sensing unit is used to measure a temperature of the connection space of the inner tube.

Preferably, the vacuum chamber has a recess disposed at a bottom of the vacuum chamber for accommodating a protrusion of the shaft sealing device.

Preferably, the vacuum chamber includes a cover lid and a chamber. An inner surface of the cover lid covers the chamber to form a reaction space between the cover lid and the chamber, and a monitor wafer is disposed on the inner surface of the cover lid.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
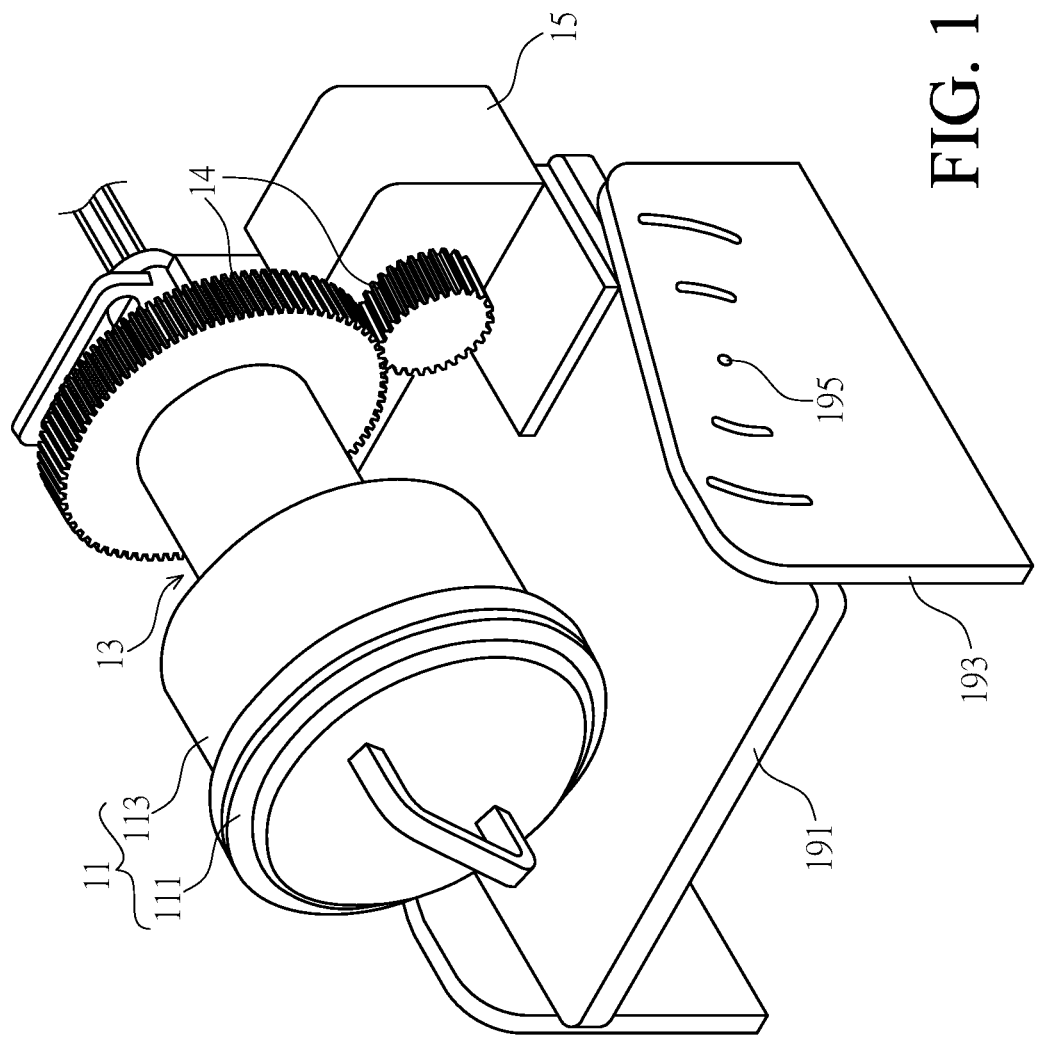
FIG. 1 is a schematic diagram of a detachable atomic layer deposition apparatus for powders according to an embodiment of the present disclosure.

Referring to FIG. 1, FIG. 2, FIG. 3 and FIG. 4, a detachable atomic layer deposition apparatus 10 for powders includes a vacuum chamber 11, a shaft sealing device 13, and a driving unit 15. As shown in the figures, the driving unit 15 is connected to the vacuum chamber 11 via the shaft sealing device 13 and drives the vacuum chamber 11 to rotate.

The vacuum chamber 11 has a reaction space 12 for accommodating a plurality of powders 121 such as quantum dots. The quantum dots may be made of semiconductor material like ZnS, CdS, CdSe, etc in groups II~VI, and a thin film formed on each of the quantum dots may be aluminum oxide ($Al_2O_3$). The vacuum chamber 11 includes a cover lid 111 and a chamber 113, wherein an inner surface 1111 of the cover lid 111 is used to cover the chamber 113 so as to form the reaction space 12 between the cover lid 111 and the chamber 113.

In one embodiment, a monitor wafer 115 is disposed on the inner surface 1111 of the cover lid 111, wherein the monitor wafer 115 is positioned inside the reaction space 12 when the cover lid 111 covers the chamber 113. During the ALD process in the reaction space 12, a thin film is formed on the surface of the monitor wafer 115. In practice, the thickness of the thin film formed on the surface of the monitor wafer 115 and the thickness of the thin film formed on the surface of the powder 121 can be measured to calculate a relation between the two thin films. Subsequently, the thickness of the thin film formed on the surface of the powder 121 can be obtained by measuring the thickness of the thin film formed on the surface of the monitor wafer 115 and converting the measured thickness based on the relation.

The shaft sealing device 13 includes an outer tube 131 and an inner tube 133, wherein the outer tube 131 has an accommodating space 132 and the inner tube 133 has at least one connection space 134. The outer tube 131 and the inner tube 133 may, for example, be hollow columnar objects. The accommodating space 132 of the outer tube 131 is used to accommodate the inner tube 133, and the outer tube 131 and the inner tube 133 are configured to be coaxial. The shaft sealing device 13 can be a common shaft seal or a magnetic fluid shaft seal that is mainly used for isolating the reaction space 12 of the vacuum chamber 11 from outer spaces to maintain vacuum in the reaction space 12.

The driving unit 15 is connected to one end of the shaft sealing device 13 and drives the vacuum chamber 11 to rotate through the shaft sealing device 13. The driving unit may, for example, be connected to the vacuum chamber 11 via the outer tube 131, and through the outer tube 131, drives the vacuum chamber 11 to rotate.

The driving unit 15 may drive the outer tube 131 and the vacuum chamber 11 to rotate continuously in one direction, like clockwise or counterclockwise. In different embodiments, the driving unit 15 may drive the outer tube 131 and the vacuum chamber 11 to rotate in the clockwise direction by a specific angle, and then in the counterclockwise direction by the specific angle; the angle is, for example, 360 degrees. As the vacuum chamber 11 rotates, the powders 121 in the reaction space 12 are stirred and agitated, which in turn facilitates the powders 121 to be heated evenly and to come in contact with a precursor gas or a non-reactive gas.

In one embodiment, the driving unit 15 is a motor, which is connected to the outer tube 131 via a gear 14, and through the gear 14, drives the outer tube 131 and the vacuum chamber 11 to rotate relative to the inner tube 133.

Figure 2:
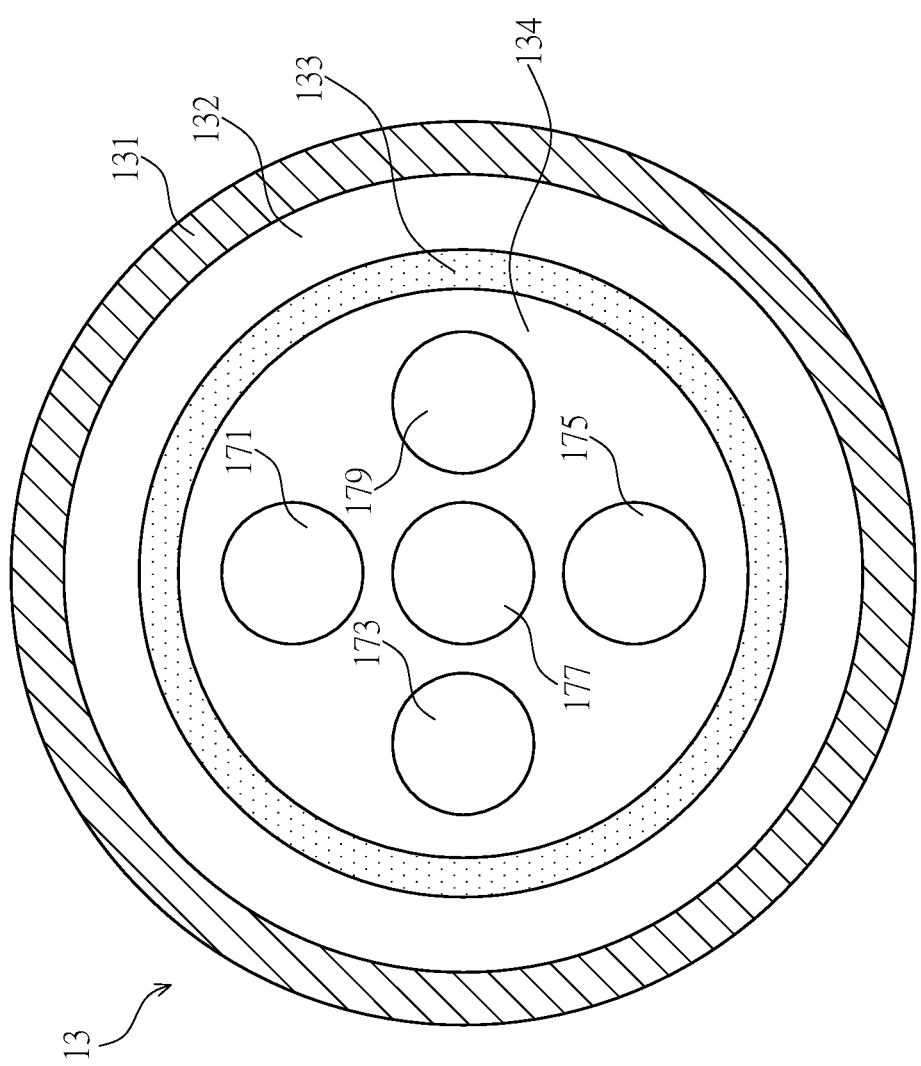
FIG. 2 is a cross-sectional schematic diagram illustrating a shaft sealing device of a detachable atomic layer deposition apparatus for powders according to an embodiment of the present disclosure.
Figure 3:
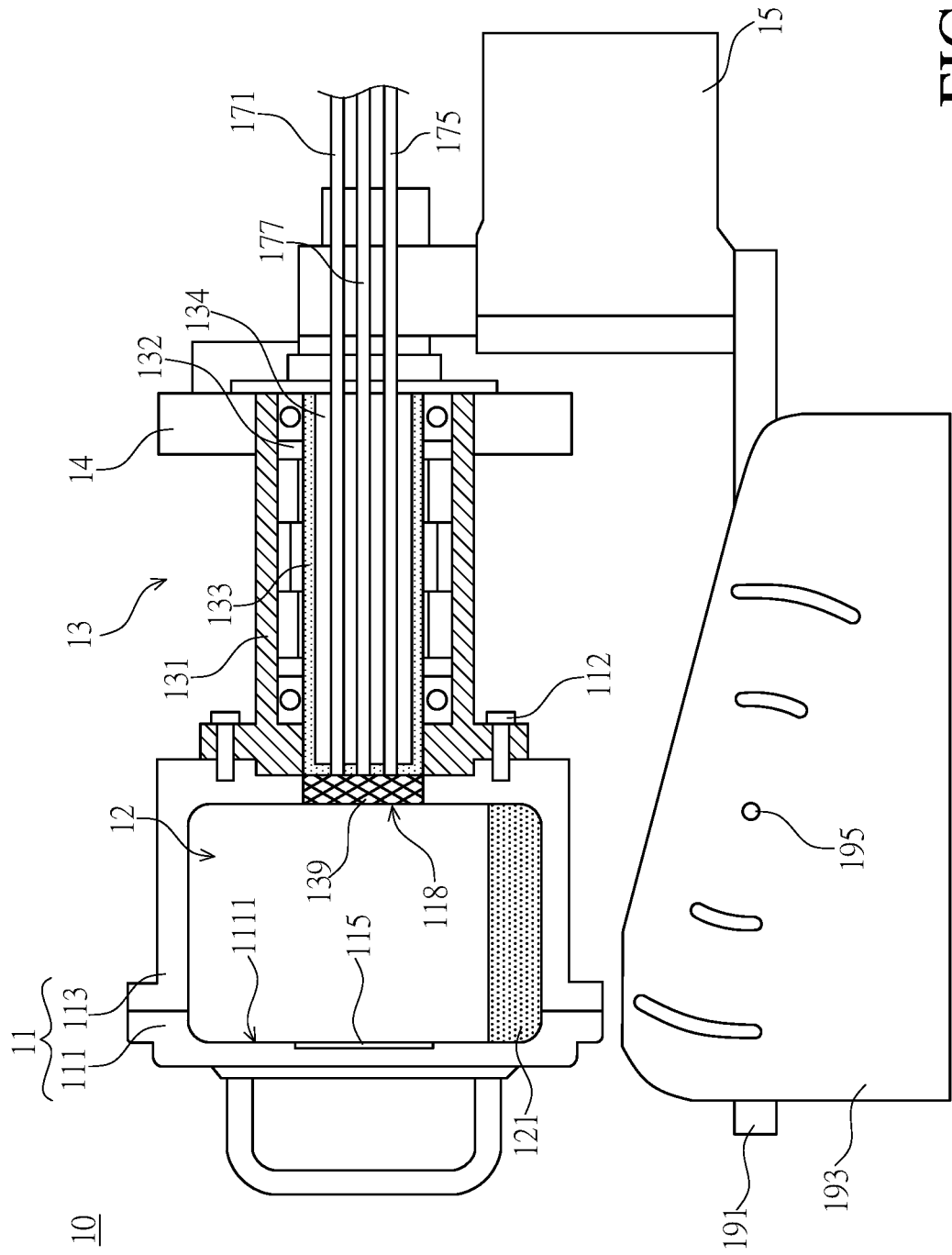
FIG. 3 is a cross-sectional schematic diagram of a detachable atomic layer deposition apparatus for powders according to an embodiment of the present disclosure.

As shown in FIG. 2 and FIG. 3, at least one air extraction line 171, at least one air intake line 173, at least one non-reactive gas line 175, a heater 177 and/or a temperature sensing unit 179 are disposed in the connection space 134 of the inner tube 133.

The air extraction line 171 is fluidly connected to the reaction space 12 of the vacuum chamber 11 and is used to extract gas from the reaction space 12 to create vacuum in the reaction space 12 for subsequent ALD process. In particular, the air extraction line 171 can connect to a pump and use the pump to extract the gas in the reaction space 12.

The air intake line 173 is fluidly connected to the reaction space 12 of the vacuum chamber 11 and is used to transport a precursor gas or a non-reactive gas to the reaction space 12, wherein the non-reactive gas may be a noble gas like nitrogen or argon. The air intake line 173 can, for example, be connected to a precursor gas storage tank and a non-reactive gas storage tank via a valve set, and through the valve set, transport the precursor gas to the reaction space 12 for the precursor gas to be deposited on the surface of each powder 121. In practical application, the air intake line 173 may transport a carrier gas together with the precursor gas to the reaction space 12. Then, the air intake line 173 transports the non-reactive gas to the reaction space 12 through the valve set in addition to the air extraction line 171 extracting gas from the reaction space 12, to remove the precursor gas in the reaction space 12. In one embodiment, the air intake line 173 is connected to a plurality of branch lines and transports different precursor gases to the reaction space 12 sequentially through the respective branch lines.

The air intake line 173 is also capable of increasing a flow of non-reactive gas delivered to the reaction space 12, so as to blow the powders 121 around in the reaction space 12 by the non-reactive gas, such that the powders 121 are carried by the non-reactive gas and diffused to various areas and all regions of the reaction space 12.

In one embodiment, the air intake line 173 includes at least one non-reactive gas line 175, wherein the non-reactive gas line 175 is fluidly connected to the reaction space 12 of the vacuum chamber 11 and is used to transport a non-reactive gas to the reaction space 12. The non-reactive gas line 175 can, for example, be connected to a nitrogen storage tank via a valve set, and through the valve set, transport nitrogen to the reaction space 12. The non-reactive gas is used to blow the powders 121 around in the reaction space 12, and in combination with the rotating of the vacuum chamber 11 driven by the driving unit 15, the powders 121 in the reaction space 12 are effectively and evenly stirred and agitated, thereby contributing in forming a thin film with a uniform thickness on the surface of each powder 121.

The air intake line 173 and the non-reactive gas line 175 of the detachable atomic layer deposition apparatus 10 for powders are both used to transport non-reactive gas to the reaction space 12. The flow of non-reactive gas transported by the air intake line 173 is smaller as the main purpose of which is for removing the precursor gas in the reaction space 12, whereas the flow of non-reactive gas transported by the non-reactive gas line 175 is larger and is mainly used to blow the powders 121 around in the reaction space 12.

More specifically, the timings at which the air intake line 173 and the non-reactive gas line 175 transport the non-reactive gas to the reaction space 12 are different. Hence, the non-reactive gas line 175 may be omitted in practical application, and instead, the flow of non-reactive gas transported by the air intake line 173 at different timings is adjusted. For instance, when removing the precursor gas from the reaction space 12, the flow of non-reactive gas being transported to the reaction space 12 by the air intake line 173 is lowered, and when blowing the powders 121 around in the reaction space 12, the flow of non-reactive gas being transported to the reaction space 12 by the air intake line 173 is enlarged.

When the driving unit 15 drives the outer tube 131 and the vacuum chamber 11 to rotate, the inner tube 133 and the air extraction line 171, the air intake line 173 and/or the non-reactive gas line 175 disposed in the inner tube 133 do not rotate along therewith, which in turn keeps a stable supply of non-reactive gas and/or precursor gas to the reaction space 12 by the air intake line 173 and/or the non-reactive gas line 175.

The heater 177 is used to heat the connection space 134 and the inner tube 133. By heating the air extraction line 171, the air intake line 173 and/or the non-reactive gas line 175 in the inner tube 133 with the heater 177, temperatures of the gases in the air extraction line 171, the air intake line 173 and/or the non-reactive gas line 175 are raised. For example, the temperature of non-reactive gas and/or precursor gas transported by the air intake line 173 to the reaction space 12 may be raised, and the temperature of non-reactive gas transported by the non-reactive gas line 175 to the reaction space 12 may be raised. As such, when the non-reactive gas and/or the precursor gas enter the reaction space 12, the temperature of the reaction space 12 would not drop or change drastically. Moreover, the temperature sensing unit 179 is used to measure the temperature of the heater 177 or the connection space 134 to monitor an operation status of the heater 177. Additional heating device 21 is also often disposed inside of, outside of, or surrounding the vacuum chamber 11, wherein the heating device is adjacent to or in contact with the vacuum chamber 11 for heating the vacuum chamber 11 and the reaction space 12.

During ALD process, the reaction space 12 of the vacuum chamber 11 is required to maintain in a vacuum condition, and so the structure of the vacuum chamber 11 is usually thicker in size and heavier in weight. The shaft sealing device 13 is used to hold and drive the vacuum chamber 11 and also is thicker in size and heavier in weight. During operation, the user needs to unload the vacuum chamber 11 together with the shaft sealing device 13 from the driving unit 15 before taking the powders 121 from the vacuum chamber 11 and clean the vacuum chamber 11. Hence, not only is there an extensive loading on the user, collisions may occur during operation or cleaning process, and thereby causing the user to be injured or the apparatus to be damaged.

To improve the aforementioned issues, the vacuum chamber 11 and the shaft sealing device 13 of the present disclosure are designed to be two independent components, wherein the vacuum chamber 11 is fixed to the shaft sealing device 13 during ALD process. Referring to FIG. 3, the vacuum chamber 11 is connected to and fixed to one end of the shaft sealing device 13 via at least one fixing member 112 such as screws. The fixing member 112 being a screw is merely an example of the present disclosure, and in practice the vacuum chamber 11 may be fixed to the shaft sealing device 13 via the fixing member 112 of any formation. For example, the vacuum chamber 11 and the shaft sealing device 13 may be connected by a detachable fixing member 112 like a cylinder connector, a locking/snap mechanism, a latch, a fast-release device, screw threads, etc.

In one embodiment, the fixing member 112, the vacuum chamber 11, and the shaft sealing device 13 are three independent components. For example, the fixing member 112 is a screw, and the vacuum chamber 11 and the shaft sealing device 13 have corresponding fixing holes disposed thereon. In another embodiment, the fixing member 112 is directly disposed on the vacuum chamber 11 and/or the shaft sealing device 13, like disposing corresponding cylinder connector and fixing hole, corresponding tenon and mortise, corresponding internal thread and external thread etc, on the vacuum chamber 11 and the shaft sealing device 13 respectively. As such, the vacuum chamber 11 can also be fixed to the shaft sealing device 13 through the fixing member 12.

The driving unit 15 drives the vacuum chamber 11 to rotate through the shaft sealing device 13, so as to stir and agitate the powders 121 in the reaction space 12 of the vacuum chamber 11. When the vacuum chamber 11 is connected to the shaft sealing device 13, the air extraction line 171, the air intake line 173 and/or the non-reactive gas line 175 are fluidly connected to the reaction space 12 of the vacuum chamber 11.

Figure 4:
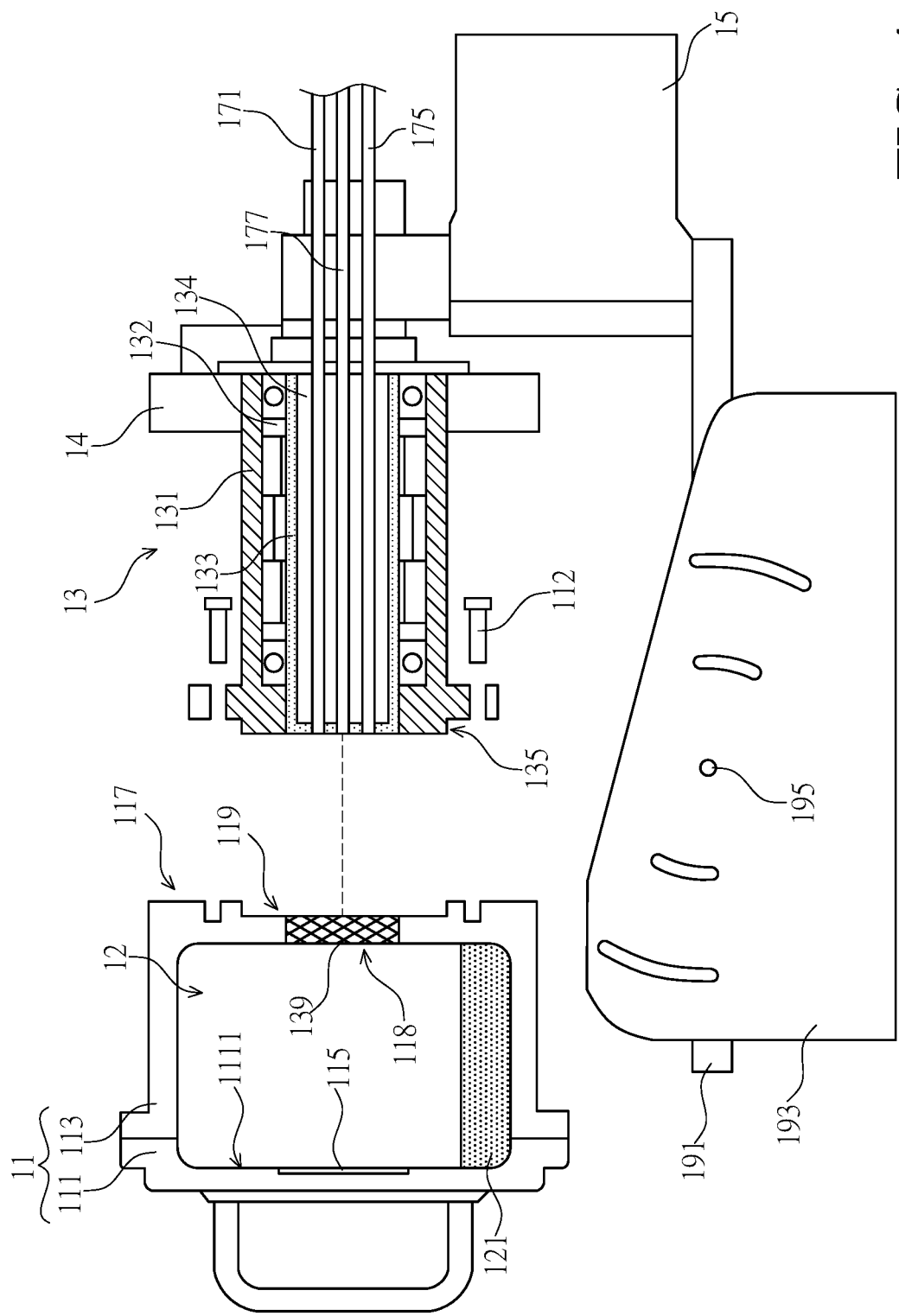
FIG. 4 is a cross-sectional exploded diagram of a detachable atomic layer deposition apparatus for powders according to an embodiment of the present disclosure.

After the ADL process, the fixing member 112 is dislodged and the vacuum chamber 11 is removed from or unloaded off the shaft sealing device 13 as shown in FIG. 4. Because the weight of the vacuum chamber 11 is less than the total weight of the vacuum chamber 11 plus the shaft sealing device 13, unloading the vacuum chamber 11 off the shaft sealing device 13 reduces the loading on the user in operating or moving around the vacuum chamber 11. The removal of the vacuum chamber 11 from the shaft sealing device 12 also makes it easier for the user to take out the powders 121 that have undergone ALD process in the vacuum chamber 11 and to clean or maintain the vacuum chamber 11 and/or the shaft sealing device 13, as well as to put new powders 121 in the reaction space 12 of the vacuum chamber 11.

In addition, the detachable atomic layer deposition apparatus 10 for powders of the present disclosure improves the process efficiency of atomic layer deposition. Specifically, a number of vacuum chambers 11 may be prepared and each vacuum chamber 11 has powders 121 placed therein. First, one of the vacuum chambers 11 is fixed to the shaft sealing device 13 and ALD process is conducted to the powders 121 in the fixed vacuum chamber 11. After the ALD process, the fixed vacuum chamber 11 and the powders 121 therein are unloaded from the shaft sealing device 13 and subsequently another one of the vacuum chambers 11 is fixed to the shaft sealing device 13 for conducing ALD process on the powders 121 in the another vacuum chamber 11. The unloaded vacuum chamber 11 is then placed in a cooling area for the unloaded vacuum chamber 11 and the powders 121 therein to cool before taking the powders 121 out of the unloaded vacuum chamber 11.

In one embodiment, a through hole 118 is disposed at the bottom 117 of the vacuum chamber 11, and the air extraction line 171, the air intake line 173, and the non-reactive gas line 175 disposed in the connection space 134 of the inner tube 133 are fluidly connected to the reaction space 12 of the vacuum chamber 11 via the through hole 118. In different embodiments, a filter 139 is disposed at the through hole 118. When the vacuum chamber 11 is connected to the shaft sealing device 13, the filter unit 139 disposed on the vacuum chamber 11 covers the inner tube 133 of the shaft sealing device 13, and the air extraction line 171, the air intake line 173 and/or the non-reactive gas line 175 in the inner tube 133 are fluidly connected to the reaction space 12 of the vacuum chamber 11 via the filter unit 139.

With the placement of the filter unit 139, the powders 121 in the reaction space 12 are prevented from being extracted out of the reaction space 12 when gas is being extracted from the reaction space 12 by the air extraction line 171, and thus a loss of powders is saved. Moreover, by placing the filter unit 139 on the vacuum chamber 11 rather than on the shaft sealing device 13, the powders 121 would not fall out from the reaction space 12 of the vacuum chamber 11 during the removal of the vacuum chamber 11 from the shaft sealing device 13.

In one embodiment, a recess 119 is disposed at the bottom 117 of the vacuum chamber 11, wherein the filter unit 139 is disposed in the recess 119, and a corresponding protrusion 135 is disposed at one end of the shaft sealing device 13 connecting to the vacuum chamber 11. When connecting the vacuum chamber 11 and the shaft sealing device 13, the protrusion 135 of the shaft sealing device 13 is pointed toward the recess 119 of the vacuum chamber to complete the alignment of the two, and then the vacuum chamber 11 is fixed to the shaft sealing device 13 through the fixing member 112.

Further, an O-ring may be disposed between the recess 119 of the vacuum chamber 11 and the protrusion 135 of the shaft sealing device 13. The O-ring can, for example, be disposed in the recess 119 of the vacuum chamber 11 or on the protrusion 135 of the shaft sealing device 13, for increasing an airtightness of the reaction space 12 in the vacuum chamber 11. In different embodiments, corresponding screw threads may be disposed on the recess 119 of the vacuum chamber 11 and the protrusion 135 of the shaft sealing device 13, wherein the vacuum chamber 11 is rotatable relative to the shaft sealing device 13 to connect to the shaft sealing device 13, and then the vacuum chamber 11 is fixed to the shaft sealing device 13 through the fixing member 112.

Figure 5:
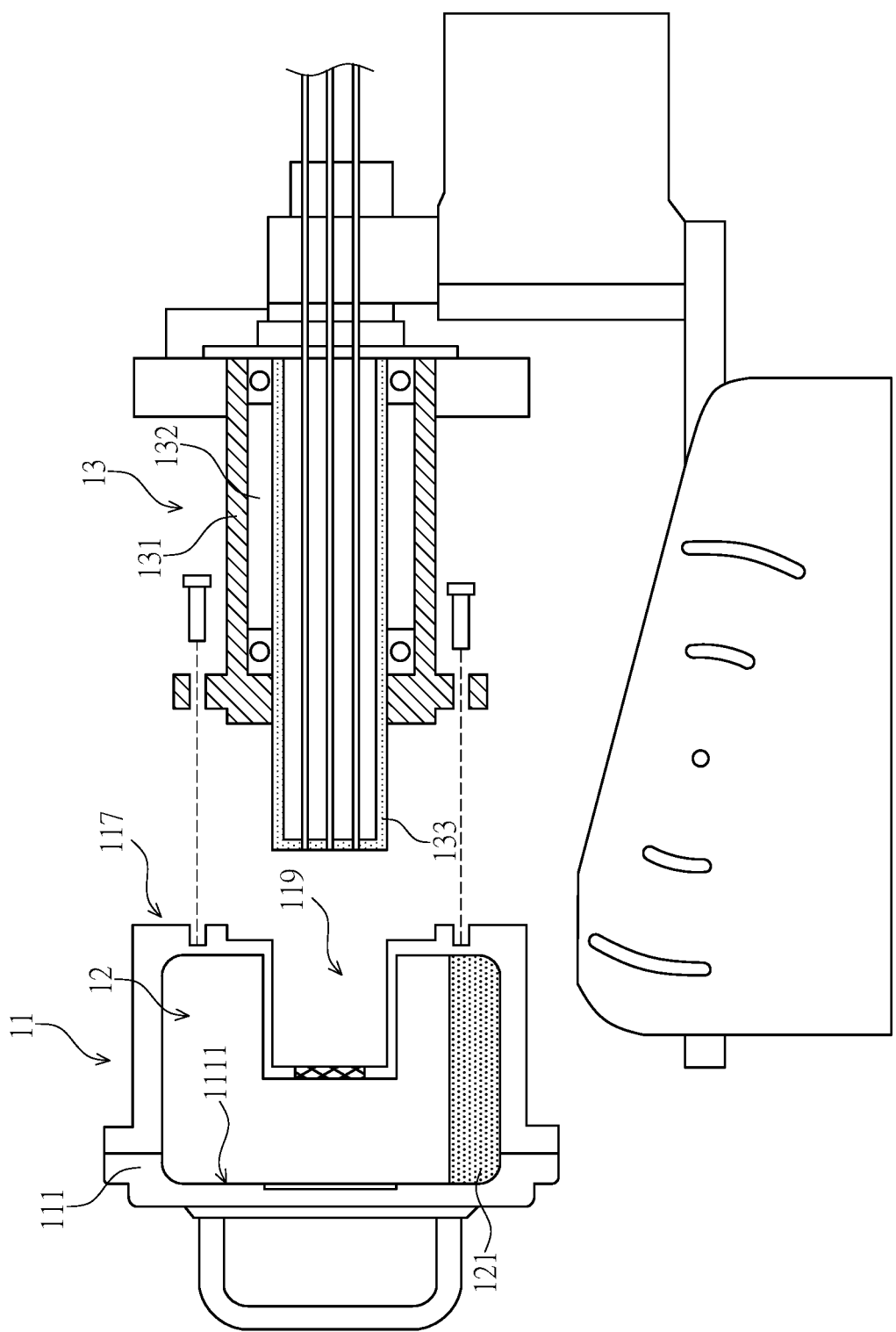
FIG. 5 is a cross-sectional exploded diagram of a detachable atomic layer deposition apparatus for powders according to another embodiment of the present disclosure.
Figure 6:
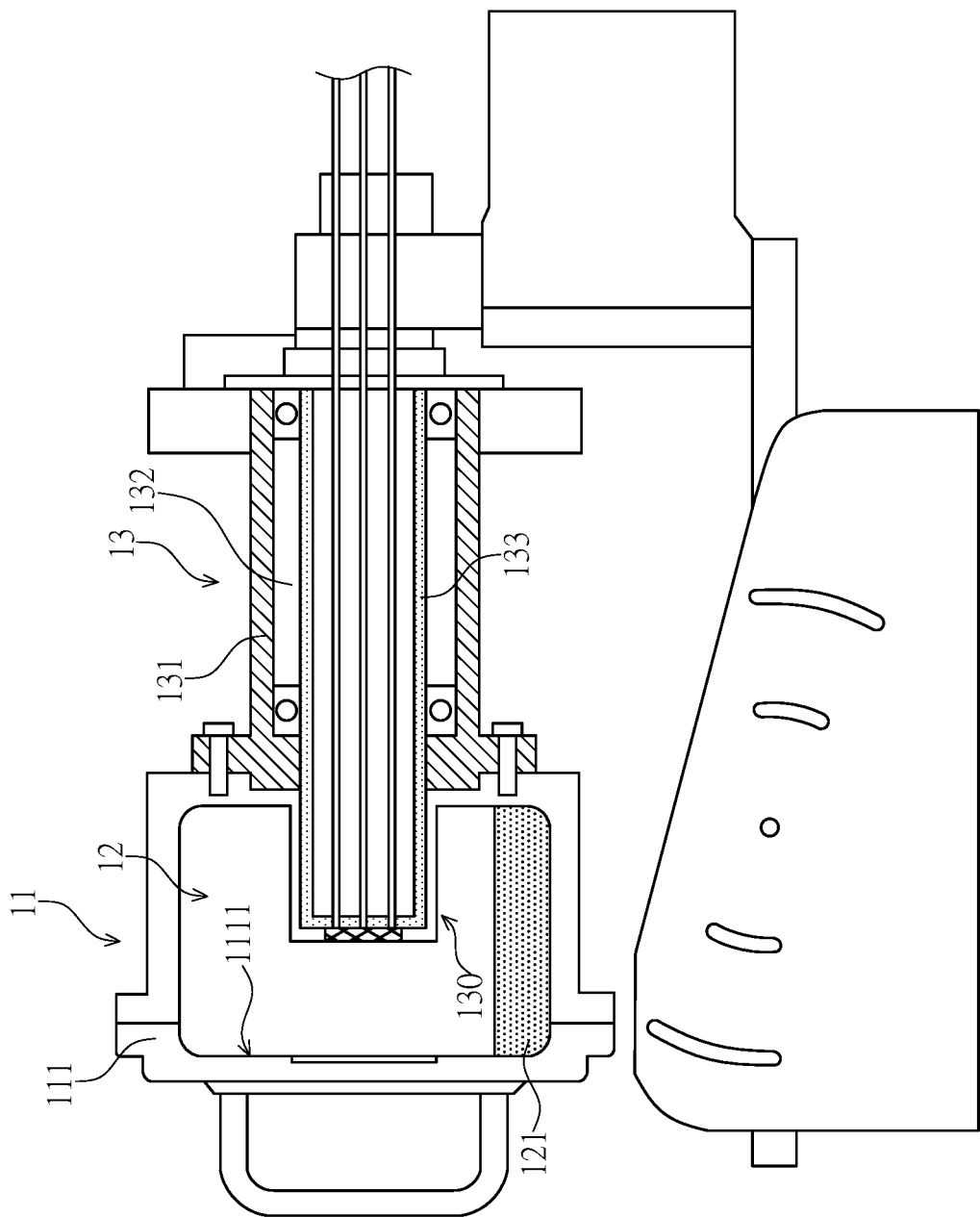
FIG. 6 is a cross-sectional schematic diagram of a detachable atomic layer deposition apparatus for powders according to another embodiment of the present disclosure.

In one embodiment, the recess 119 extends from the bottom 117 of the vacuum chamber 11 to the reaction space 12, and the inner tube 133 of the shaft sealing device 13 extends from the accommodating space 132 of the outer tube 131 to the outside and protrudes from the shaft sealing device 13 and the outer tube 131, as shown in FIG. 5. Referring to FIG. 6, when the vacuum chamber 11 and the shaft sealing device 13 are being connected, the part of the inner tube 133 protruding from the shaft sealing device 13 is inserted into the recess 119. When the vacuum chamber 11 is connected to the shaft sealing device 13, the inner tube 133 of the shaft sealing device 13 extends from the accommodating space 132 of the outer tube 131 to the recess 119 of the vacuum chamber 11 and/or the reaction space 12, so that the inner tube 133 and the recess 119 form a protruding tube part 130 in the reaction space 12.

Through the arrangement of the protruding tube part 130, a distance between the air intake line 173 and/or the non-reactive gas line 175 and the cover lid 111 may be shortened or adjusted, so that the non-reactive gas transported to the reaction space 12 by the air intake line 173 and/or the non-reactive gas line 175 can be delivered or passed on to the inner surface 1111 of the cover lid 111. The non-reactive gas then flows through out the reaction space 11 through the inner surface 1111 of the cover lid 111 for blowing the powders 121 around in the reaction space 121.

In one embodiment, the detachable atomic layer deposition apparatus 10 for powders further includes a support base 191 and at least one mount bracket 193, wherein the support base 191 is a board body for placing the driving unit 15, the vacuum chamber 11, and the shaft sealing device 13. The support base 191 is connected to the driving unit 15, and is connected to the shaft sealing device 13 and the vacuum chamber 11 via the driving unit 15. The shaft sealing device 13 and/or the vacuum chamber 11 can also be connected to the support base 191 via at least one support member so as to enhance the stability of connection.

The support base 191 is connected to the mount bracket 193 via at least one connecting shaft 195, wherein the number of mount brackets 193 is two and the two mount brackets 193 are respectively disposed at two sides of the support base 191. The support base 191 is rotatable relative to the mount brackets 193 with the connecting shaft 195 as axis, so as to change an inclination angle of the driving unit 15, the shaft sealing device 13, and the vacuum chamber 11, and in turn assist in the formation of a thin film with a uniform thickness on the surface of each powder 121.

Figure 7:
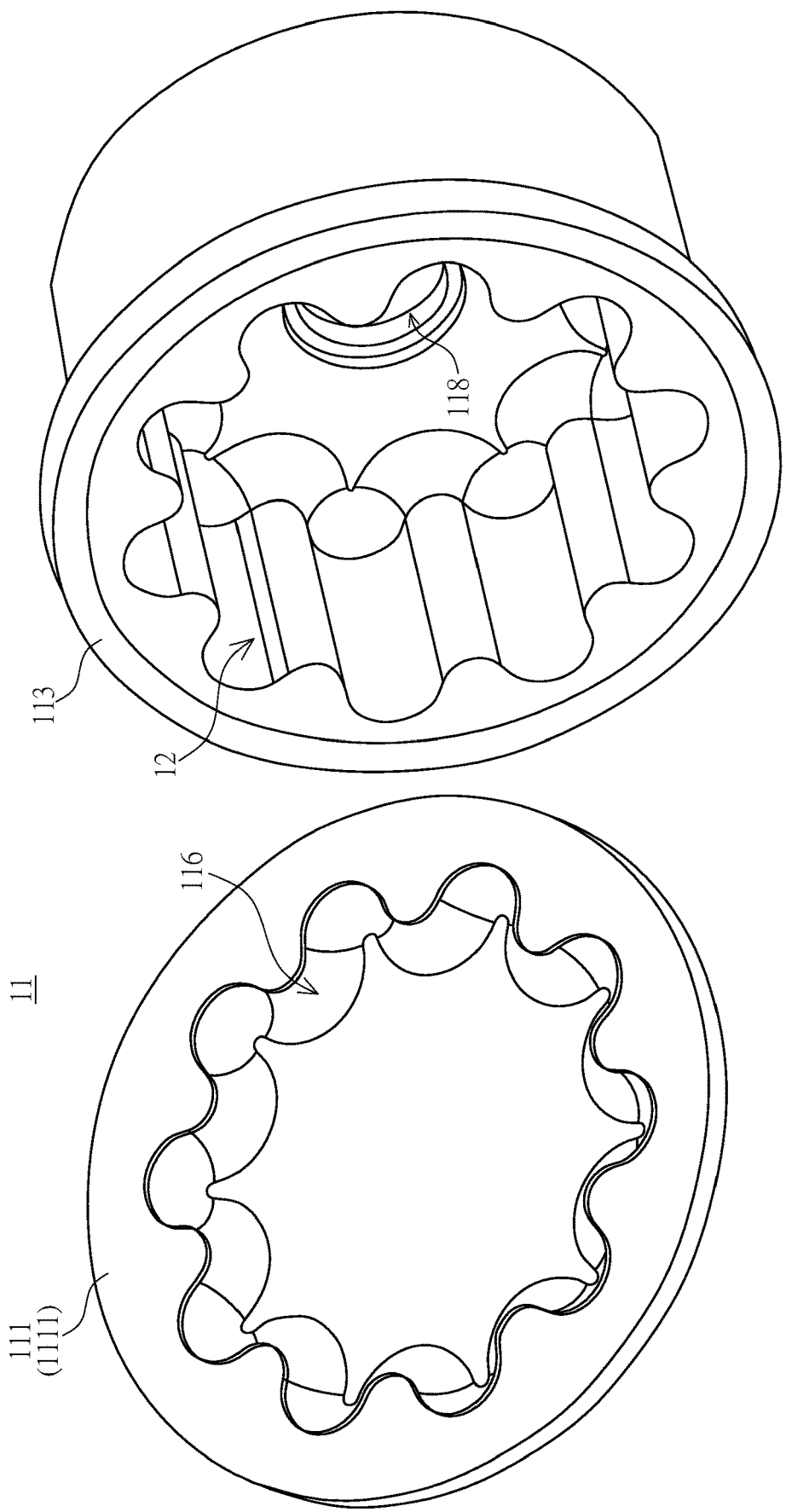
FIG. 7 is an exploded schematic diagram illustrating a vacuum chamber of a detachable atomic layer deposition apparatus for powders according to an embodiment of the present disclosure.

In one embodiment as shown in FIG. 7, the cover lid 111 has a wavy circular recess 116, a polygonal recess, or at least one circular recess disposed on the inner surface 1111, and the chamber 113 has a wavy circular space or a polygonal space. When the cover lid 111 is connected to the chamber 113, the reaction space 12 with wavy circular columnar shape or with polygonal columnar shape is formed between the cover lid 111 and the chamber 113.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

The invention claimed is:

1. A detachable atomic layer deposition apparatus for powders, comprising:

a shaft sealing device, comprising an outer tube and an inner tube, wherein the outer tube comprises an accommodating space for accommodating the inner tube, and the inner tube comprises at least one connection space;

a driving unit, connected to the shaft sealing device;

a vacuum chamber, comprising a reaction space for accommodating a plurality of powders, wherein the vacuum chamber is fixed to the shaft sealing device via at least one fixing member and separates from the shaft sealing device when the fixing member is dislodged, wherein the driving unit connects to the vacuum chamber through the outer tube of the shaft sealing device and drives the vacuum chamber to rotate through the outer tube of the shaft sealing device, wherein when the driving unit drives the vacuum chamber to rotate through the outer tube of the shaft sealing device, the inner tube does not rotate along therewith;

at least one air extraction line, located within the inner tube and fluidly connected to the reaction space of the vacuum chamber, for extracting a gas from the reaction space; and at least one air intake line, located within the inner tube and fluidly connected to the reaction space of the vacuum chamber, for transporting a precursor gas or a non-reactive gas to the reaction space, wherein the non-reactive gas blows the powders around in the reaction space.

2. The detachable atomic layer deposition apparatus of claim 1, wherein the shaft sealing device is a magnetic fluid shaft seal.

3. The detachable atomic layer deposition apparatus of claim 1, wherein the air intake line comprises at least one non-reactive gas line disposed in the connection space of the inner tube and fluidly connected to the reaction space of the vacuum chamber, for transporting the non-reactive gas to the reaction space of the vacuum chamber to blow the powders around in the reaction space.

4. The detachable atomic layer deposition apparatus of claim 3, wherein the vacuum chamber comprises a through hole disposed at a bottom of the vacuum chamber, and the air extraction line, and the air intake line disposed in the connection space of the inner tube are fluidly connected to the reaction space of the vacuum chamber via the through hole.

5. The detachable atomic layer deposition apparatus of claim 4, further comprising a filter unit, disposed in the through hole of the vacuum chamber, and the air extraction line and the air intake line are fluidly connected to the reaction space of the vacuum chamber via the filter unit.

6. The detachable atomic layer deposition apparatus of claim 1, wherein the vacuum chamber comprises a cover lid, a chamber, and a monitor wafer, an inner surface of the cover lid covers the chamber to form the reaction space between the cover lid and the chamber, and the monitor wafer is disposed on the inner surface of the cover lid.

7. The detachable atomic layer deposition apparatus of claim 6, wherein the cover lid comprises a wavy circular recess disposed on the inner surface of the cover lid, the chamber comprises a wavy circular space, and the wavy circular recess of the cover lid and the wavy circular space of the chamber form the reaction space with wavy circular columnar shape.

8. The detachable atomic layer deposition apparatus of claim 6, wherein the cover lid comprises a polygonal recess disposed on the inner surface of the cover lid, the chamber comprises a polygonal space, and the polygonal recess of the cover lid and the polygonal space of the chamber form the reaction space with polygonal columnar shape.

* * * * *